(12) United States Patent
Brown et al.

(10) Patent No.: US 6,360,340 B1
(45) Date of Patent: *Mar. 19, 2002

(54) MEMORY TESTER WITH DATA COMPRESSION

(75) Inventors: Benjamin J. Brown, Lake Oswego; Robert B. Gage, Beaverton, both of OR (US); John F. Donaldson; Alexander Joffe, both of Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/752,414

(22) Filed: Nov. 19, 1996

(51) Int. Cl.[7] ................................ G01R 31/28
(52) U.S. Cl. .......................... 714/718; 714/25
(58) Field of Search ................... 371/21.1, 21.6, 371/27.5, 40.2, 40.3, 41; 395/182.03, 182.06, 183.07, 183.13, 183.21, 185.01; 324/73.1; 348/397; 714/25, 27, 30, 42, 48, 718, 723

(56) References Cited

U.S. PATENT DOCUMENTS

| | | | | |
|---|---|---|---|---|
| 4,627,053 A | * | 12/1986 | Yamaki et al. | 371/10 |
| 4,628,509 A | * | 12/1986 | Kawaguchi | 371/21 |
| 4,876,685 A | * | 10/1989 | Rich | 371/21.6 |
| 5,173,906 A | | 12/1992 | Dreibelbis et al. | 371/22.5 |
| 5,317,573 A | * | 5/1994 | Bula et al. | 371/10.3 |
| 5,600,373 A | * | 2/1997 | Chui et al. | 348/397 |
| 5,617,531 A | * | 4/1997 | Crouch et al. | 395/183.06 |
| 5,644,578 A | * | 7/1997 | Ohsawa | 371/21.2 |

* cited by examiner

Primary Examiner—Nadeem Iqbal
(74) Attorney, Agent, or Firm—Lance M. Kreisman

(57) ABSTRACT

A semiconductor memory test system with improved fault data processing and display capabilities. The memory tester includes a lossless data compressor for failure data. Compression allows failure data to be more rapidly transferred to a display device that is part of a work station controlling the memory tester. It also reduces the amount of data that must be stored in the display memory, thereby providing a cost effective way to store data from multiple tests. By allowing data for multiple tests to be stored, the data from a prior test can be used to control the formatting of data for a subsequent test. Such formatting is useful for such things as observing failure mechanisms as the operating temperature or speed of the semiconductor memory under test increases.

20 Claims, 2 Drawing Sheets

MEMORY TESTER WITH DATA COMPRESSION

This invention relates generally to automatic test equipment and more specifically to automatic test equipment used in the manufacture of semiconductor memories.

Semiconductor memories are tested during their manufacture with automatic test equipment. The test indicates which cells within the memory are faulty. To test a memory very quickly, the results of the test on each cell are stored in a very fast memory inside the tester called a catch RAM. This information is then accessed, either at a later time or by other circuitry.

Information about faulty cells is used in many different ways. It might, for example, be used in process control. The number or position of the faults in a memory can indicate a problem with the manufacturing process. The fault information might be stored in a non-volatile memory for later processing or graphically displayed for a human operator. Usually, the fault information is displayed in a two dimensional array, with the position of a faulty cell in the display correlating with the physical position of that cell on the surface of the memory chip. Clusters or patterns of faults might be recognized and used to identify problems in the manufacturing process. In this way, adjustments might be made to the memory manufacturing process to improve the process yield.

A difficulty with displaying fault information graphically is the amount of information that must be transferred to a display device is very large. The transfer process is therefore very slow. For example, a typical memory size is 64 Megabits. Even if a bit of data can be passed every 2 microseconds, the total time to transfer all the information to the display device is on the order of 2 minutes.

Two minutes is a very long time during a semiconductor manufacturing operation. To meet throughput targets for memory manufacture, a memory should be tested in a matter of seconds. One way that the data transfer time is reduced is through the use of lossy compression. Lossy compression is performed by combining groups of adjacent cells into one bit of data. If any cell in the group is faulty, the entire group is indicated as faulty. A typical grouping might combine sixteen cells into one group. However, even with this amount of compression, the transfer time from the catch RAM to the display might still be about eight seconds, which is a long time. In addition, if more detailed analysis of the faults within the memory is required, the data required for the analysis is not available.

A further problem with display of information in current memory testers is that the data is not always in an easily comprehensible form. One of the main reasons for graphically displaying failure information in a memory tester is to allow quick identification of problems in the memory manufacturing process.

It would be highly desirable to increase the transfer rate of data to a display processor in a memory tester so that the time required to present information on a memory being tested is very short. It would also be desirable to be able to present the data in a fashion that allowed problems to be identified more readily.

SUMMARY OF THE INVENTION

With the foregoing background in mind, it is an object of the invention to provide lossless compression of data within a memory tester.

It is also an object to provide multiple display formats of data in a memory tester.

The foregoing and other objects are achieved in a semiconductor memory tester with data transfer circuitry coupled to a display having a lossless compressor. In a preferred embodiment, the lossless compressor is a run length encoder.

In an alternative embodiment, the data compression circuit includes a plurality of display memories and a gating circuit. The contents of one memory can be used as an input to the gating circuit to control storage of information in another memory. In one embodiment, the gating circuit can be controlled to accumulate in one of the memories failures detected during tests of multiple parts. In another embodiment, the gating circuit is controlled to store in one of the memories failures that appear when the same part is tested under different conditions.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
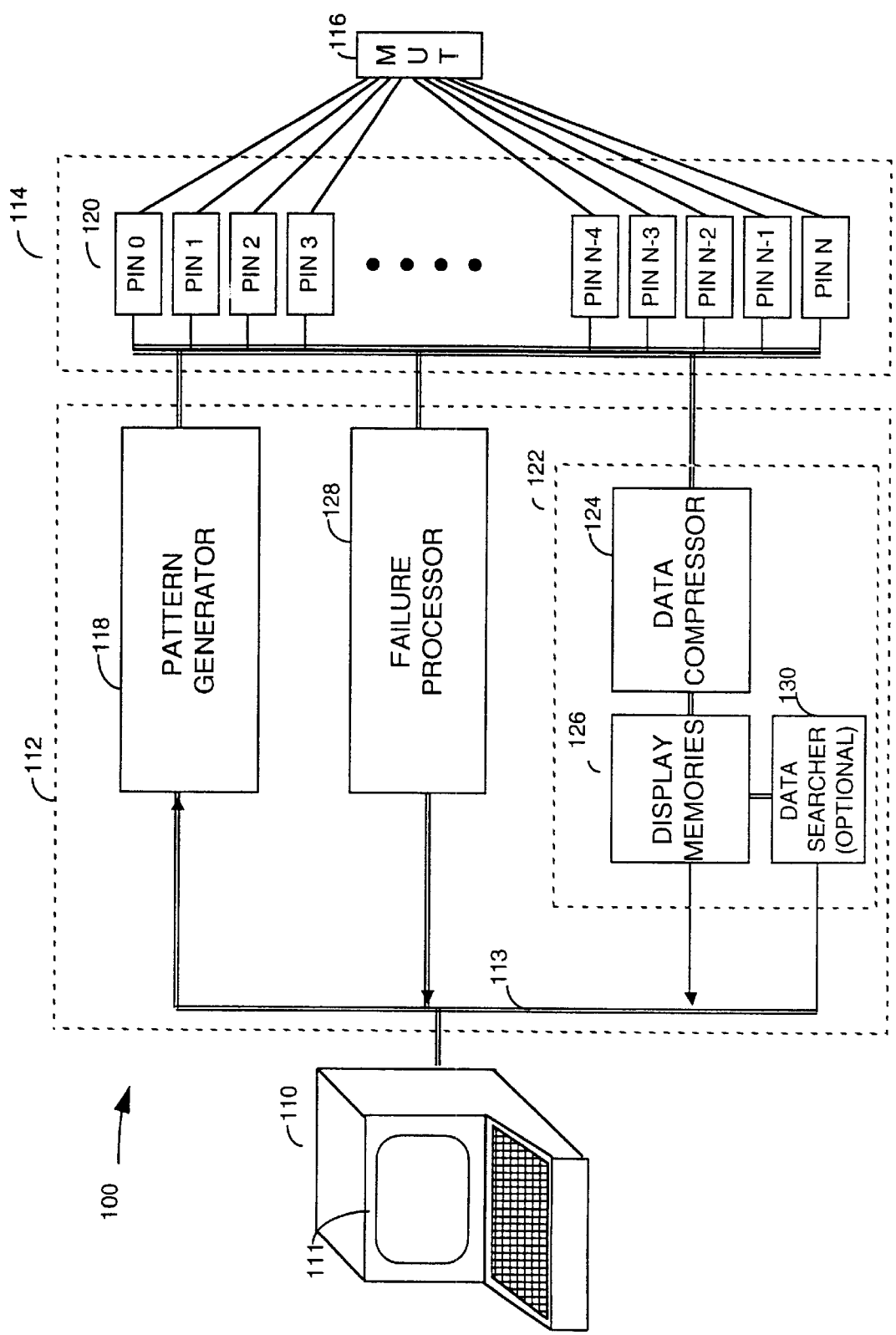
FIG. 1 shows a simplified block diagram of a memory tester incorporating the invention.

FIG. 1 shows a simplified block diagram of a semiconductor memory tester 100. Tester 100 includes a work station 110, which serves as a user interface. Workstation 110 might, for example, be a SUN® work station, including a display screen 111.

Tester 100 also includes a tester main frame 112 and a test head 114. Test head 114 makes contacts to multiple points on a memory under test (MUT) 116. In this way, multiple signals can be applied and measured at MUT 116, allowing defects to be detected.

The test patterns applied to MUT 116 are generated by pattern generator 118. Pattern generator 118 could reproduce patterns stored in memory. Alternatively, pattern generator 118 could be what is known as an algorithmic pattern generator which generates a pattern according to a programmed algorithm.

Pattern generator 118 provides pattern inputs to numerous pin electronics circuits 120 in test head 114. The pattern data specifies, for each cycle of tester operation, the data value to be applied or read from one test point on the memory under test 116. The pin electronics 120 drive or measure the appropriate voltage levels at the appropriate time. Pin electronics 120 include the high speed catch RAM (not numbered) that store the results of the test.

The pin electronic circuits 120 are also connected to a failure processor 128. Failure processor 128 receives values from the catch RAM within pin electronics 120. It analyzes this data and determines whether physical changes can be made to MUT 116, such as with a laser repair station, to allow MUT 116 to fully function. Memory repair is a well known step in the manufacture of semiconductor memories.

The catch RAMs within pin electronics 120 are also connected to display processor 122. Display processor 122 receives data from the catch RAMs and can perform lossy compression as in the prior art, if desired, to reduce the total amount of data. If necessary, it also "unscrambles" the data from the catch RAM, also as in the prior art. In some instances, the addresses of locations within MUT 116 are assigned such that some memory locations that are physically adjacent to each other do not have consecutive addresses. To make a display showing the physical layout of MUT 116, it is sometimes necessary to "unscramble" the addresses.

Display processor 122 data compressor 124, which performs novel data processing functions including lossless data compression and image comparisons. Data compressor 124 is described below in conjunction with FIG. 2. The output of data compressor 124 is passed to display memories 126. Display memories 126 store the compressed data as it will be displayed on display 111 of work station 110.

Display processor 122 also is shown to include an optional data searcher 130. As will be described below, data searcher 130 can be used to provide lossless data compression in a very simple and low cost way. It could, optionally, be used in place of the lossless data compression circuitry in data compressor 124 where image comparison functions are not required.

Work station 110 and test head 114 are as in the prior art. Tester main frame 112 is also similar to the prior art except it includes data processor 122, which will be described in greater detail below. One of skill in the art will appreciate that memory tester 100 contains control circuitry that is not expressly shown. The operations of the tester are specified by software and firmware executed by that controller. In addition to the differences in the hardware, the software and firmware will differ from the prior art. However, one of skill in the art could easily write the control software or firmware to control the functions described below.

Figure 2:
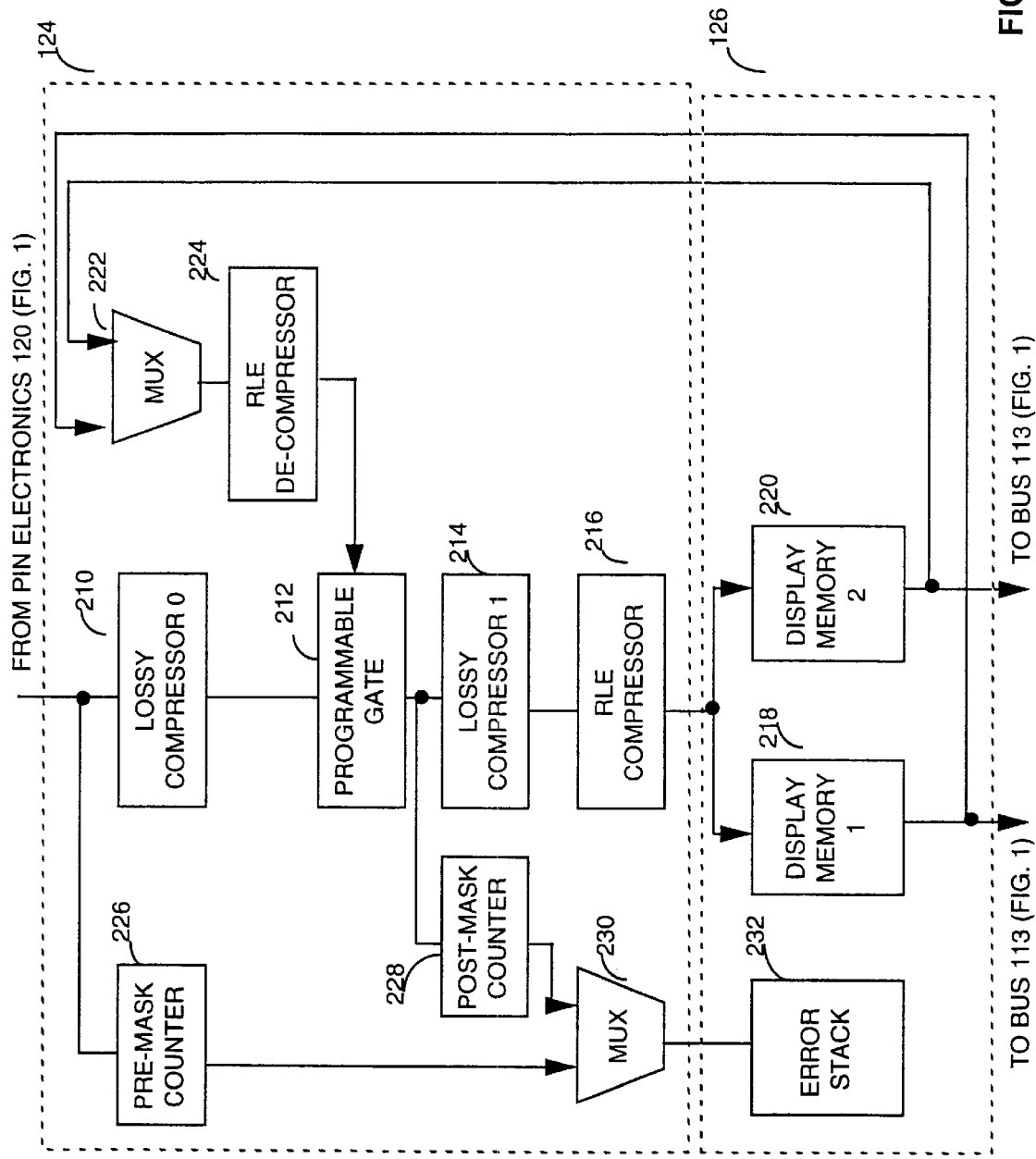
FIG. 2 shows a more detailed block diagram of the data compressor of FIG. 1.

Turning now to FIG. 2, data compressor 124 and display memories 126 are shown in greater detail. Input data is first applied to lossy compressor 210. The input data represents a stream of bits, each bit corresponding to one location in MUT 116. Bits with a value of logic 1 in a preferred embodiment indicate that a fault was detected at that location when MUT 116 was tested. A logic 0 indicates that no fault was detected. Lossy compressor 210 is a lossy compressor as in the prior art and can be programmed to perform one of several functions.

Lossy compressor 210 can be disabled through programming such that it performs no function. Alternatively, it can be programmed to compress adjacent bits in a row of data. MUT 116 is organized as a number of rows of cells with each row containing multiple columns. The input data stream to data compressor 124 includes failure information for one complete row followed by the failure information for the next complete row. To compress by row, some number of adjacent bits are logically ORed together. The exact number of bits ORed together indicates the compression ratio. The exact number is not critical to the invention and is preferable programmable.

Lossy compressor 210 can also be programmed to compress adjacent bits in a column of data. To compress by column, the bits in one row must be stored as they are read in. As the bits in the next row are read in, the are logically ORed with the bits already stored, on a bit by bit basis. The ORed result replaces the previously stored values. Once the appropriate number of rows have been read in and ORed together, the resulting bits are provided as an output row of bits. The appropriate number of rows that are ORed together is not critical to the invention and preferably can be programmed.

The output of lossy compressor 210 represents a second data stream. The bits in the data stream indicate whether there was a failure in corresponding bits in MUT 116. Where lossy compressor 210 was programmed to provide compression, then the stream indicates whether there were failures in any of the bits in corresponding groups of bits.

The second data stream is applied to a programmable gate 212. Programmable gate 212 is, in a preferred embodiment, an ASIC or a set of gates on an ASIC. Programmable gate 212 can be controlled to perform one of several functions. These functions are explained in greater detail below. However, they are all intended to allow the data to be presented on display 111 in a format that makes it easy to analyze faults. One such function of programmable gate 212 is to pass the second data stream through to its output without modification.

A second function that programmable gate 212 can be controlled to perform is to combine the second data stream at the output of lossy compressor 210 with the output of RLE de-compressor 224. Those two data streams are combined on a bit per bit basis. The combination can be made by ANDing or ORing the bits together. A "new fails" function can also be implemented. The "new fails" function compares a value from lossy compressor 210 with a value from RLE de-compressor 224. It produces a logical 1 output when the value from RLE de-compressor 224 is a logical 1 and the corresponding value from lossy compressor 210 is a logical 0. These functions can be used to present test data in many useful formats, that will be described in greater detail below.

Another function that programmable gate 212 can be controlled to perform is inversion of the data stream. As described above, a logical 1 is used in the preferred embodiment to signify a faulty cell. Much of the processing that will be described relates to processing the cells represented by a logical 1. This processing relates to formatting the information on the faulty cells in MUT 116. In general, the focus in a manufacturing operation is on the faults so that they might be eliminated. However, it might be desirable in some instances to focus on passing cells. For example, if a change were made to MUT 116, it might be desirable to see how many more cells passed testing. Inverting the data streams by converting logical 1's to logical 0's allows the fault processing circuitry to be used to process information on passing cells.

The output of programmable gate 212 is applied as an input stream to lossy compressor 214. Lossy compressor 214 is the same as lossy compressor 210. Lossy compressor 214 can be controlled to provide no compression, compress by row or compress by column. It could be used in conjunction with lossy compressor 210 to provide compression in both the row and column directions or to provide twice the compression in either the row or column direction.

The lossy compressors 210 and 214 can also be used separately to provide compression either before or after the input data stream is processed by programmable gate 212.

The output of lossy compressor 214 is provided to RLE compressor 216. RLE compressor 216 is a loss-less compressor. In a preferred embodiment, RLE compressor 216 is a run length encoder. Run length encoding is a known technique for compressing data. The compression is performed by counting the number of consecutive logic 1's or logic 0's that occur. The output of RLE compressor 216 is a series of multibit words. The first word in the series represents the number of consecutive 0's starting with the first data value. The next word represents the number of consecutive 1's following the first string of consecutive 0's. The words alternate in this fashion, representing alternatively the number of consecutive 1's and 0's.

Run length encoding is particularly well suited for compressing test data in a semiconductor memory tester. Most of the cells of a memory will generally function. When failures do occur, they are likely to occur in clusters. The data will likely contain many long streams of 0's interspersed with streams of 1's. The total number of digital words needed to represent all the faults in a memory is one more than the number of clusters of faulty cells. Thus, the entire stream is represented by a relatively few digital words.

The digital words produced by RLE compressor 216 are stored in display memory 126. Display memory 126 contains two separate memories 218 and 220. The output stream of digital words from RLE compressor 216 can be controlled to be stored in either memory 218 or 220. Because display memories 218 and 220 store data in a compressed format, each can be significantly smaller than a traditional display processor memory. Therefore, multiple display memories can be used without a high cost. Multiple display memories are used in formatting the failure data as will be described below.

The information stored in display memories will, in the course of performing tests on MUT 116, be available for graphical display on display 111. The information in either display memory 218 or 220 might be selected by work station 110. The information will be read over bus 113 (FIG. 1). Work station 110 contains a general purpose computer and can be readily programmed to decompress the data it reads over bus 113 prior to displaying it on display screen 111.

The information in display memories 218 and 220 can also be passed to programmable gate 212. Multiplexer 222 selects the output of one of the memories 218 or 220 for application to RLE decompressor 224. RLE de-compressor 224 expands the series of digital words made by RLE compressor 216 back into a stream of bits, with one bit representing one cell in MUT 116 or, where compressor 210 or 214 was enabled, a group of cells. RLE de-compression is well known in the art of digital signal processing.

Data compressor 124 additionally comprises counters 226 and 228. In some instances, it is not necessary to store failure data for each cell in MUT 116. Often, it is sufficient to know how many cells within the memory are faulty.

Counter 226 counts the number of faulty cells in the input data stream. Counter 228 counts the number of faulty cells in the data stream after formatting by programmable gate 212. As will be described below, data compressor 124 can be used to identify only the cells that have failed or passed testing in comparison to a previous test. Counter 228 can therefore be used to count the number of cells that gave different results on different tests.

Multiplexer 230 selects between the outputs of counters 226 and 228. The selected output is stored in error stack 232. Error stack 232 holds error counts for multiple memories that are tested.

Operation

Data compressor 124 can be programmed to perform multiple functions. It can be programmed to perform prior art row and column compression by enabling both lossy compressors 210 and 214 and setting programmable gate 212 to simply pass the data through.

Data compressor 126 can also be programmed to compress data to be passed to work station 110 for display. Either display memory 218 or 220 can be read over a bus 113 (FIG. 1). Reading a memory over a bus is often the bottleneck in displaying large amounts of information. By passing the information in compressed format, that bottleneck is eliminated or at least substantially reduced. To display the full failure data, work station 110 can decompress the compressed data and display it.

If desired, display memory 218 might store failure data generated when memory test system 100 tests a first memory under test. Memory 220 might store failure data generated when memory test system 100 tests a second memory under test. The failure data of two parts might then be displayed simultaneously.

Alternatively, display memories 218 and 220 could be loaded with failure data taken for the same memory under test 116 under two different conditions. Semiconductor devices are often tested at different speeds or at different operating temperatures. It is sometimes important to see how the memory fails as the speed or temperature is increased. Having two display memories allows the failure data for the same memory to be displayed simultaneously for comparison.

However, it would be highly desirable in some situations if that comparison were automated. The flexible configuration of display processor 124 allows the comparison to be automated. It can be operated in a two pass mode, storing test results in one display memory 218 or 220 during the first pass. During the second pass, the test results stored during the first pass are applied through multiplexer 222 to a control input of programmable gate 212 and would be used to filter the data taken in the second pass.

For example, display processor 124 could be operated to store in display memory 218 test results from a test on MUT 116 at a first speed. The same MUT might then be retested at a second speed. During the second test, the data in display memory 218 would then be read out of display memory 218 and applied through multiplexer 222 and RLE de-compressor to programmable gate 212. If programmable gate 212 is set to its "new fails" function, the effect will be to screen out cells that failed in both situations and highlight cells that failed when the operating conditions changed. Such a display might, for example, be useful in highlighting regions of MUT 116 that fail as the operating speed increases. The formatted results would then be stored in display memory 220.

As another example, programmable gate 212 could be set to its AND function. Under these circumstances, the filtered data in the second pass would highlight those tests that failed both tests. If the same test were performed in both passes, this operation would filter our spurious failures.

FIG. 1 shows an optional data searcher 130 that can be used to provide loss-less data compression in accordance with the invention. If data searcher 130 were to be used, data compressor 124 could be a prior art data compressor. Display memories 126 could also be a single display memory as in the prior art. Rather than compressing data before it is stored in display memory 126, data searcher 130 compresses the data as it is read from display memory 126. In operation, data searcher 130 reads bits from display memory 126 until it finds a failure. The address of this failure defines a string of passing cells. Data searcher then searches display memory 126 until it finds a passing cell. The address of the passing cell defines a string of failing cells. By searching in this fashion, data searcher 130 is generating information equivalent to the information generated by RLE compressor 216. The information could be provided by specifying the addresses of the start and stop of each such string or by specifying the start address of each string and its length. Alternatively, it could be provided by specifying the length of strings of 0's and 1's. Regardless of the exact manner in which the data is represented, the total amount of data needed to represent all of the passing and failing cells in display memory 126 will be reduced.

Because data searcher 130 is directly connected to display memory 126 rather than over a system bus, it can read values from display memory 126 much faster than they could be passed to work station 110, resulting in significant time saving.

Data searcher 130 could be a very simple circuit controlled largely by the general purpose computer that is part of work station 110. For example, it could start searching memory 126 in response to a command over bus 113. It would then provide the information on the first string back over bus 113. Once this value was read by work station 110, data searcher 130 would search for the next value. Alternatively, data searcher 130 could have two portions, with one portion of the circuit searching for information on the strings and buffering that information in a memory. The other part of the circuitry could provide that information over bus 113 as fast as work station 110 could read it. The exact implementation of the data transfer function is not critical to the invention.

It should also be appreciated that data compressor 124 is designed to be programmed to perform many different functions. As an example of the flexibility of display processor 124, programmable gate 212 could be set to its OR function. In that case, the data in display memory 220 would represent the accumulation of faults from both tests.

The filtering of data need not be limited to a two pass mode of operation. If a third pass were used, the values in display 220 would be passed to the control inputs of programmable gate 212 and the results from the third pass would be stored in display memory 218.

For example, multiple memories could be tested in sequence and all of the faulty cells might be accumulated by setting programmable gate 212 to its OR function. Alternatively, programmable gate 212 could be set in its AND mode and the resulting data would show faults that are common to all the memories tested. Operation in this fashion would be useful in highlighting process problems in the manufacture of the memories that always produce faulty cells in certain regions of the memory under test.

It is not necessary that display processor be used in multi-pass mode. In single pass mode, programmable gate 212 is set to pass data through without filtering. Even in single pass mode, substantial benefits can be obtained. A series of tests run on approximately 1,000 memories indicated that a simple run length encoder reduced the number of bits needed to represent the faulty cells in a memory to one half of one percent of the original.

Having described one embodiment, numerous alternative embodiments or variations might be made. For example, the invention has been described in conjunction with a memory tester. It could be used equally well in a logic tester or a mixed signal tester which test memory circuits. For example, many microprocessor contain memories. Though the microprocessor is tested on a logic tester, a portion of that logic tester is operating as a memory tester.

As another example, FIG. 2 shows that two display memories 218 and 220 are used. An important advantage of having two memories is that the results of one test can be stored in one memory. During a second test, those results can be read out of the first memory and used to gate the results of a second test as they are being passed to a second memory. In this way, the data stored in the second memory can be given one of several very useful formats. However, it is not necessary that two separate memories be used to achieve this advantage. A memory can be pipelined such that information can be read and written simultaneously. It is just necessary that the information be read from a particular location before data is written into that location. Where run length encoding is used, it might be difficult to ensure this result. For that reason, multiple memories are preferred.

The invention was described above mainly as being used to display failure data for a memory graphically. It could also be used to transfer data to a digital signal processor that analyzed the data in digital format. Using run length encoding is very useful for speeding up the data transfer. Where the compressed data is a fraction of the size of the uncompressed data, the data transfer time is reduced proportionately.

The invention might also be used with other data output devices. For example, it would often be desirable to use display processor 124 to compress data prior storing it in a mass storage system,, such as a disk drive. In a manufacturing environment, it is often desirable to store data taken during a production run and later analyzing it if a problem is detected with that production run.

As another variation, it is not necessary that run length encoding be used. As mentioned above, this specific coding is useful for many types of memories that tend to have clustered faults. However, other compression techniques might be used.

Therefore, the invention should be limited only by the spirit and scope of the appended claims.

What is claimed is:

1. A memory test system comprising:
   a) a semiconductor memory tester;
   b) means, within the semiconductor memory tester, for generating a stream of data representing faulty cells within a memory under test;
   c) an output device;
   d) a bus connecting the output device to the semiconductor memory tester; and
   e) a display processor, connected to receive the stream of data as an input and to provide a processed stream of data as an output on the bus, the display processor comprising a lossless data compression circuit.

2. The memory test system of claim 1 wherein the output device comprises a display screen.

3. The memory test system of claim 1 wherein the lossless data compression circuit comprises a run length encoder.

4. The memory test system of claim 1 wherein the display processor includes a display memory and the lossless data compression circuit is connected at the input of the display memory to store compressed data in the display memory.

5. The memory test system of claim 1 wherein the display processor includes a display memory and the lossless data compression circuit is connected at the output of the display memory to compress data from the display memory as it is passed to the bus.

6. The memory test system of claim 5 wherein the output device comprises a work station with a display screen and the lossless data compressor is controlled by commands sent by the work station over the bus.

7. The memory test system of claim 1 wherein the display processor comprises a plurality of display memories, each holding compressed data for at least one test.

8. The memory test system of claim 7 additionally comprising means, connected to the plurality of display memories, for combining the data from a first test with data from a second test and storing the combined data in one of the plurality of display memories.

9. The memory test system of claim 8 wherein the data from the first test and the data from the second test is combined to indicate new failures in the second test not occurring in the first test.

10. A memory test system comprising:
    a) a semiconductor memory tester;

b) means, within the semiconductor memory tester, for generating a stream of data representing faulty cells within a memory under test;

c) an output device;

d) a display processor, connected to receive the stream of data as an input and to provide a processed stream of data to the output device, the display processor comprising a gating circuit having a first data input and a second data input, the first data input coupled to the stream of data as an input, the gating circuit comprising means for combining values at the first data input with values at the second data input in accordance with a programmable function to provide the processed data output;

e) at least one memory having an input and an output, the at least one memory connected to selectively receive the processed data at its input and to provide data from its output to the second data input of the gating circuit.

11. The memory test system of claim 10 wherein the gating circuit comprises means for generating a logical one output when a bit at the first data input is a logical 1 and the corresponding bit at the second data input is a logical 0.

12. The memory test system of claim 10 wherein the gating circuitry comprises means for selectively inverting the data stream at the first data input.

13. The memory test system of claim 10 wherein the means for combining values at the first data input and the second data input comprises means for logically ANDing the values at the first data input and the second data input.

14. The memory test system of claim 13 wherein the means for combining values at the first data input and the second data input comprises means for logically ORing the values at the first data input and the second data input.

15. The memory test system of claim 10 additionally comprising:

a) means, within the display processor, for compressing the processed data stream;

b) means, connected between the output of the at least one memory and the second data input of the display processor, for decompressing data.

16. The memory test system of claim 10 additionally comprising:

a) a counter connected to the output of the gating circuit; and b) an error stack for receiving the output of the counter after the display processor has processed data for a test.

17. A memory test system comprising:

a) a semiconductor memory tester;

b) means, within the semiconductor memory tester, for generating a stream of data representing faulty cells within a memory under test;

c) a display processor, connected to receive the stream of data as an input, including a run length encoder, the run length encoder providing as an output a compressed data stream.

18. The memory test system of claim 17 additionally comprising a display memory with an input, with the run length encoder connected to compress data provided to the input of the display memory.

19. The display memory of claim 17 additionally comprising:

a) a display memory with an input and an output, b) a work station connected to receive data from the display processor, with the run length encoder connected to compress data read at the output of the display memory.

20. The memory test system of claim 19 additionally comprising:

a) a work station with a display means; and b) a bus connecting the work station to the display processor with the run length encoder directly connected to the display memory.

* * * * *